United States Patent [19]

Fukushima et al.

[11] 3,851,263

[45] Nov. 26, 1974

[54] DEMODULATOR FOR FREQUENCY-MODULATED SIGNAL

[75] Inventors: Isao Fukushima; Shin-ichi Ohashi, both of Toyokawa, Japan

[73] Assignee: Hitachi, Ltd., Tokyo, Japan

[22] Filed: Nov. 12, 1973

[21] Appl. No.: 415,004

[30] Foreign Application Priority Data

Nov. 13, 1972 Japan .............................. 47.112935

[52] U.S. Cl. .................. 329/110, 325/348, 329/136

[51] Int. Cl. ............................................ H03c 3/28

[58] Field of Search ........... 329/110, 136, 150, 168, 329/169, 170; 325/347, 348, 478, 477, 474

[56] References Cited

UNITED STATES PATENTS

| | | | |
|---|---|---|---|
| 2,831,106 | 4/1958 | Clark | 325/348 X |
| 3,603,884 | 9/1971 | Zaura et al. | 325/348 |

*Primary Examiner*—Alfred L. Brody
*Attorney, Agent, or Firm*—Craig & Antonelli

[57] ABSTRACT

A demodulator for a frequency-modulated signal which makes the demodulated output maximum in a tuned state to the frequency of the received signal in which a least distorted demodulated signal is provided and which makes it rapidly attenuate with detuning comprises an expedient for feeding the DC output component of the frequency discriminator through the signal processing circuit including a full-wave rectifier back to the amplitude limiter to control the amplitude limiting level. The signal processing circuit is composed of a low-pass filter for deriving the DC component from the output signal of the frequency discriminator, the full-wave rectifying circuit for rectifying the output of the low-pass filter, and an amplifier supplied with the full-wave rectified DC component for producing a voltage which is maximum when the frequency of the input signal of the frequency discriminator is substantially at the center of the frequency characteristic of the discriminator and which decreases as the input frequency deviates from the central frequency. The amplitude limiter varies the amplitude limiting level in accordance with the magnitude of the voltage produced by the signal processing circuit.

6 Claims, 6 Drawing Figures

DEMODULATOR FOR FREQUENCY-MODULATED SIGNAL

BACKGROUND OF THE INVENTION

1. Field of the Invention

The present invention relates to a demodulator for a frequency modulation (FM) receiver, and more particularly, to a demodulator capable of providing optimum tuning with a minimum of distortion by reducing the signal output level depending on the degree of the out of tuning in order to minimize the non-linear distortion of the frequency discriminator resulting from the slight detuning of an FM receiver and by detecting a maximum point of the signal output.

2. Description of the Prior Art

In a conventional demodulator in an FM receiver a high frequency input signal selected by a tuning circuit is converted into an intermediate frequency signal by a mixer through the use of an output signal of a local oscillator, eliminated therefrom an amplitude modulated component through an intermediate frequency amplifier and an amplitude limiter, and then demodulated by a frequency discriminator. In this case, if the central frequency of the intermediate frequency signal is in agreement with the central frequency of the frequency discriminator, the distortion of the output signal is minimum. However, if the central frequency of the intermediate frequency signal deviates from the central frequency of the frequency discriminator, the distortion of the output signal increases with the discrepancy therebetween. If the discrepancy between the central frequencies further increases, the output signal results in noise only. This noise appears markedly particularly in a high gain frequency modulation receiver which amplifies external and internal noises to output their irregular phase variation component to grate upon the ears to a large extent.

To overcome this difficulty, in conventional receiver such an output control device is often provided as has the function that a switch succeeding a frequency discriminator is controlled by a DC voltage obtained by rectifying an intermediate frequency signal divided from an intermediate frequency amplifier to be made conductive only when the intermediate frequency signal exists. However, though such an output control device can eliminate the noise, the output of the intermediate frequency discriminator is reduced only a little by the action of an amplitude limiter when the input intermediate frequency deviates from the central frequency of the frequency discriminator only slightly, so that the switch remains in its conductive state to give a considerably distorted signal. Consequently, it is difficult for such a conventional output control device to provide an only slightly distorted output of the frequency discriminator around the tuned point.

For this reason, a high grade conventional FM receiver is provided with an indicator for indicating the DC output of the frequency discriminator. Then the tuning operation is performed in accordance with the instruction of the indicator such that the central frequency of the input signal to the frequency discriminator is put into agreement with the central frequency of the latter. However, this countermeasure has the disadvantage that a second indicator for indicating the intensity of the intermediate frequency signal is necessary because the indication of the former indicator is the same as that when the signals are in agreement with each other even when no input signal to the frequency discriminator is there.

Consequently, the tuning operation is complicated and moreover the arrangement is expensive.

SUMMARY OF THE INVENTION

An object of the present invention is to provide a demodulator for an FM receiver easy in tuning operation.

Another object of the present invention is to provide a demodulator for frequency modulated signals capable of producing an output which is maximum with a low degree of distortion only around the tuned point.

A further object of the present invention is to provide a demodulator for frequency modulated signals capable of automatic frequency control of a received frequency.

In order to achieve the above objects the present invention provides a conventional demodulator for frequency modulated signals with a low-pass filter for passing the DC component of the output signal of a frequency discriminator, means for full-wave rectifying the output of the low-pass filter, and means for amplifying the full-wave rectified signal to control the limiting level of an amplitude limiter preceding the frequency discriminator by the output signal of said amplifying means. Thus, according to the present invention, if the central frequency of the input signal of the frequency discriminator deviates from the tuned point even around the tuned point, the magnitude of the input signal of the frequency discriminator is reduced to provide a maximum output signal only at the tuned point.

FIG. **2*a*** is a graph of a typical characteristic of a frequency discriminator.

FIG. **2*b*** is a frequency versus output voltage characteristic of the frequency discriminator which is full-wave rectified and phase inverted.

Figure 1:
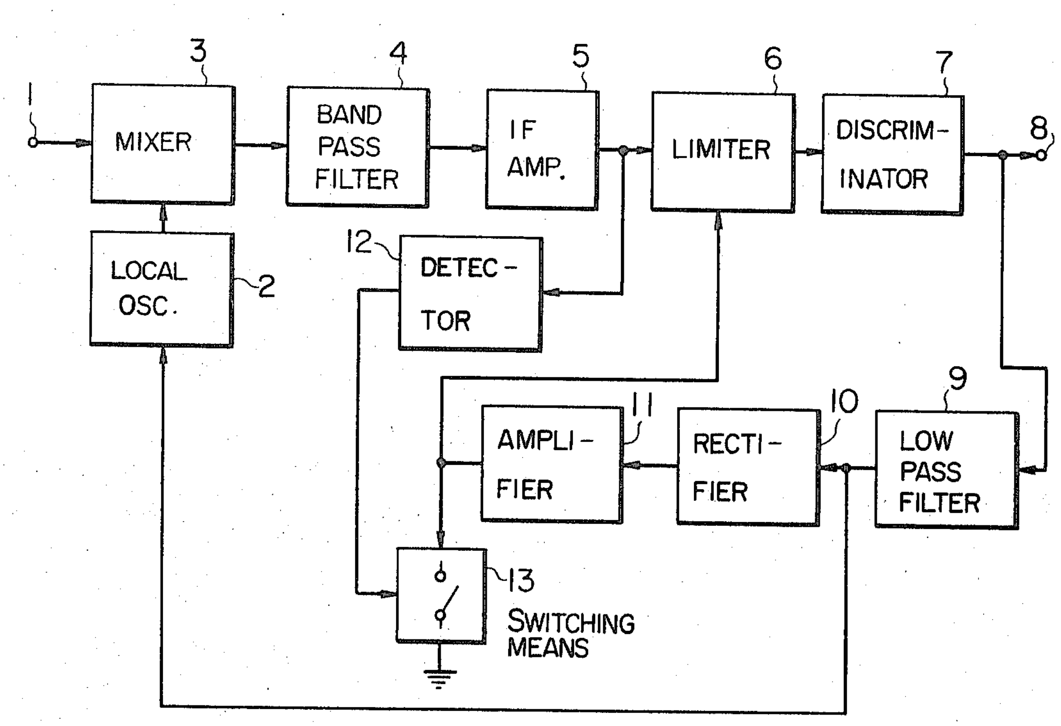
FIG. 1 is a block diagram of an embodiment of the present invention.

FIG. **2*c* is an output voltage versus frequency characteristic of the amplifier in FIG. 1**.

FIG. **2*d* is a frequency characteristic of the signal for controlling the amplitude limiting level of the amplitude limiter in FIG. 1**.

Figure 3:
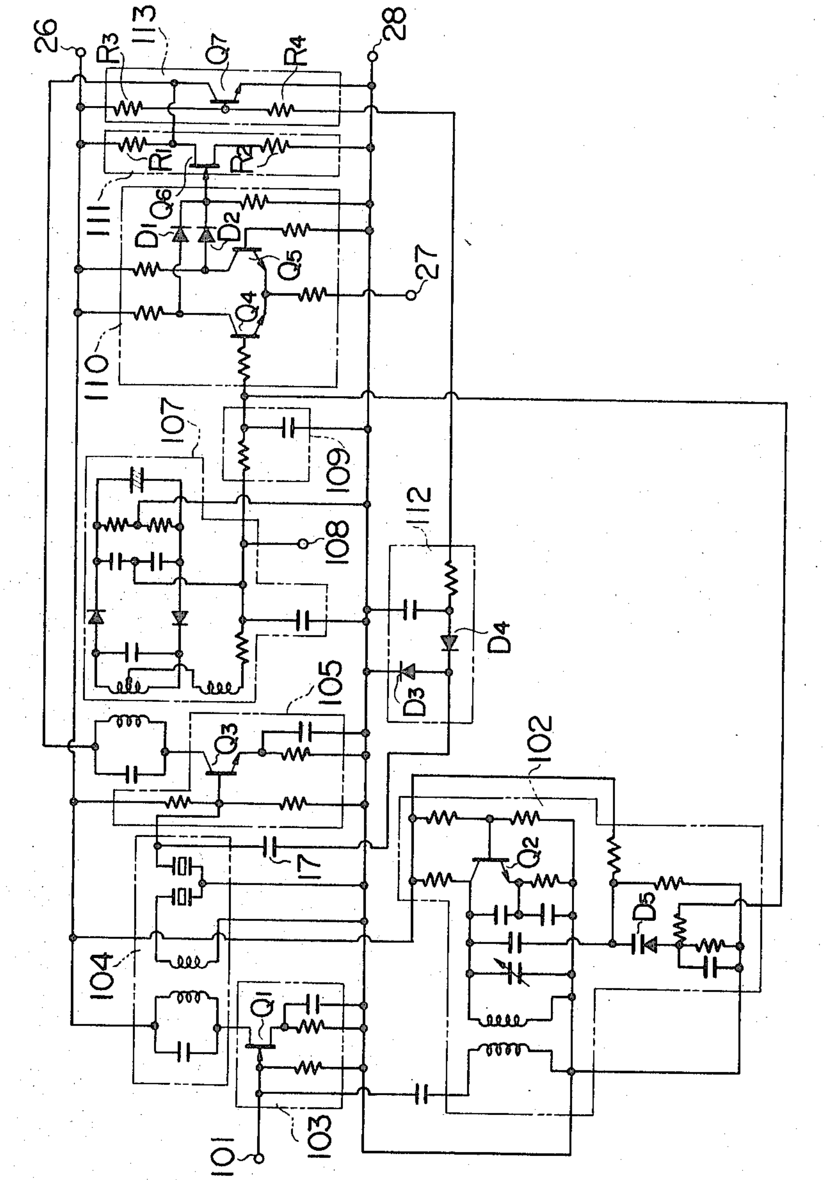

FIG. 3 is a practical circuit diagram of an embodiment of the present invention.

DESCRIPTION OF THE PREFERRED EMBODIMENT

The operation of the arrangement according to the present invention will be described referring to FIGS. 1 and **2*a* to 2*d***.

Referring to FIG. 1 a high frequency input signal supplied to an input terminal 1 is mixed with the output of a local oscillator 2 by a mixer 3 to be converted into an intermediate frequency signal. The intermediate frequency signal is deprived of unnecessary signal and noise components outside the intermediate frequency band by a band-pass filter 4, amplified by an intermediate frequency amplifier 5, and then deprived of the amplitude modulated component by an amplitude limiter 6 to be supplied to a frequency discriminator 7. The amplitude limiter 6 may be combined with the intermediate frequency amplifier 5 into one circuit having both functions.

The frequency discriminator 7 outputs a voltage correspondingly to the instantaneous frequency of the intermediate frequency signal thus providing the original signal at an output terminal 8 which is demodulated from the frequency modulated signal.

A signal divided from the output signal of the frequency discriminator 7 is passed through a low-pass filter 9, full-wave rectified by a full-wave rectifier 10 and then supplied to an amplifier 11.

Figure 2A:
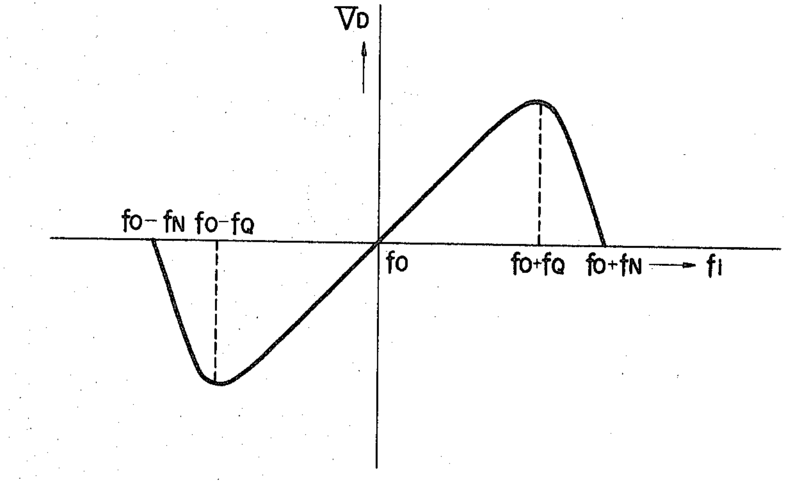
Figures 2B, 2C, 2D:
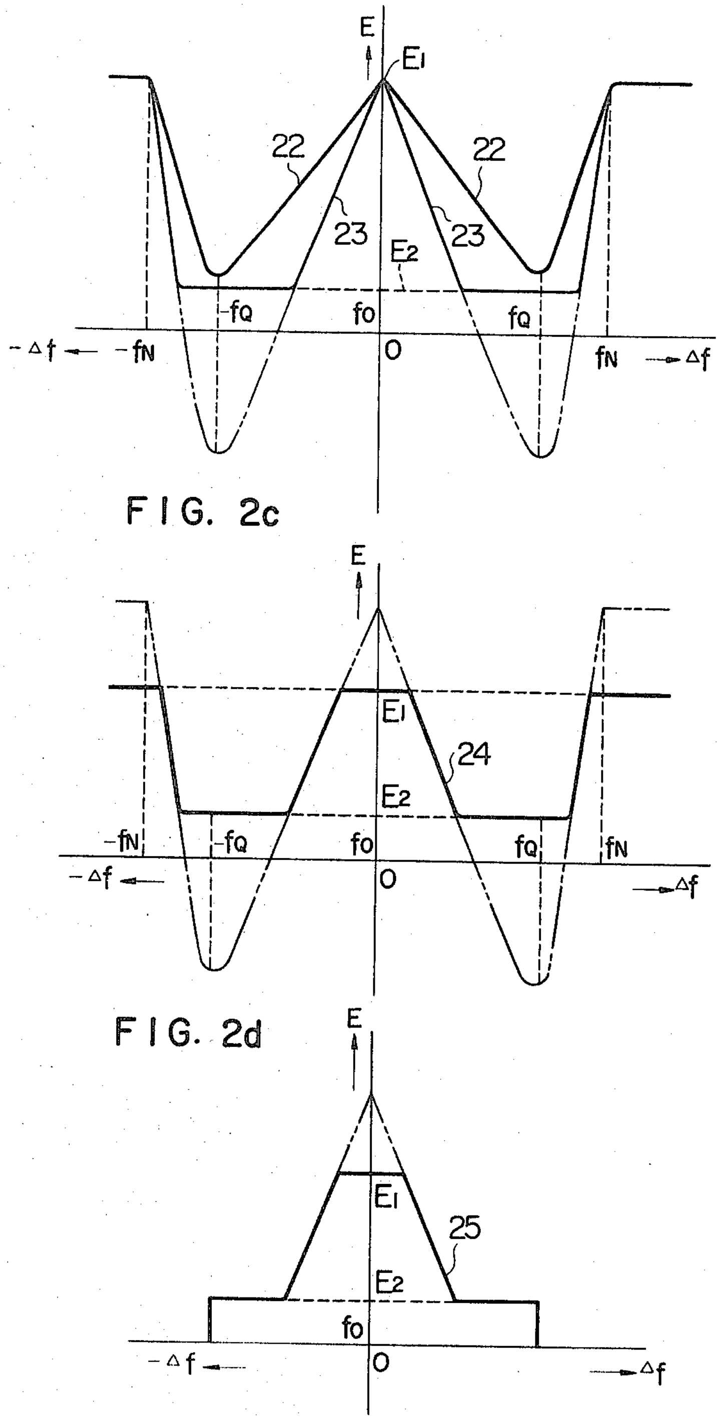

FIG. 2a shows a typical characteristic of the frequency discriminator 7 in which the abscissa represents the frequency and the ordinate represents the output voltage. When the central frequency of the input signal of the frequency discriminator 7 agrees with $f_o$, the least distorted output signal can be obtained. When the output signal of the frequency discriminator 7 is supplied to the full-wave recifier 10 through the low-pass filter 9 and is further phase-inverted by the amplifier 11, the frequency versus output voltage characteristic shown by reference numeral 22 in FIG. 2*b* can be provided. If the gain of the amplifier 11 is made large such that the amplifier 11 is saturated for a large input signal, the characteristic is one as indicated by reference numeral 23 in FIG. 2*b*. In FIG. 2*b* the character $E_1$ designates, the cut-off voltage of the amplifier, and the character $E_2$ designates the saturation voltage. By appropriately selecting the bias voltage of the amplifier 11 the characteristic 23 in FIG. 2*b* can be changed to the characteristic 24 shown in FIG. 2*c* in which the output voltage does not vary immediately around the central frequency. When the output voltage of the amplifier 11 having such a characteristic is supplied to the amplitude limiter 6 to control the amplitude limiting level, the intermediate frequency signal supplied to the frequency discriminator 7 is maximum in the state that where central frequency of the intermediate frequency signal is in agreement with or quite near to the central frequency of the frequency discriminator 7 and as the frequency deviates therefrom, it decreases. Consequently, also the amplitude of the demodulated signal provided at the output terminal 8 is maximum when the central frequency of the intermediate frequency signal is in agreement with the central frequency of the discriminator 7, i.e., around the tuned point and gradually decreases with detuning.

However, in this state, as the detuning goes further the output of the discriminator 7 again increases and eventually a completely detuned state is reached to produce noise. To prevent the production of this noise the following measure will be sufficient.

As shown in FIG. 1 the output of the intermediate frequency amplifier 5 is supplied to a detector 12 the output of which controls a switching device 13. The switching device 13 is to on-off controls the output signal of the amplifier 11. As a simple structure of the switching device a one which grounds the output of the amplifier 11 wll do. Since the amplitude of the intermediate frequency signal decreases with the detuning by the band-pass filter 4, a completely detuned state can be detected by the detector 12. By controlling the switching means 13 by the output signal of the detector 12 the output voltage of the amplifier 11 which controls the amplitude limiter 6 can be made zero when the detuning exceeds a certain frequency as shown by the curve 25 in FIG. 2*d*. Consequently, the amplitude limiting level of the amplitude limiter 6 may be made zero so that the signal to be supplied to the discriminator 7 is blocked. Also, the noise output can be blocked by not supplying the output of the discriminator 7 to the output terminal 8 by arranging the switching means 13 on the output side of the frequency discriminator 7 as conventionally practised.

By arranging in the above manner the demodulated output of the frequency discriminator 7 becomes maximum and least in the distortion only at the tuned point and rapidly attenuates with the detuning not to output noise. Similarly, when going from a detuned point to the tuned point, the output rapidly increases as the tuned point is approached. Consequently, in a receiver using such a demodulator the tuning operation is very easy.

The characteristics of FIGS. 2*b* to 2*d* can be obtained by another expedient such as the amplitude limiter 6 in place of the amplifier 11 as desired.

Such an automatic frequency control as negatively feeding the output of the low-pass filter 9 back to the oscillator 2 as shown in FIG. 1 is effected only around the tuned point because, for the above-described reason, the output of the frequency discriminator 7 exists only when the central frequency of the intermediate frequency signal is around the tuned point. Consequently, there are not such disadvantages as masking and drawing which existed in the conventional arrangement, and even if there is a fluctuation of the local oscillation frequency, the distortion of the demodulated output can be minimized by always putting the input intermediate frequency around the tuned point.

FIG. 3 is a practical circuit diagram of an embodiment of the present invention. Reference numeral 101 designates an input terminal, reference numeral 102 designates a Colpitts type local oscillator employing a transistor $Q_2$ and a variable capacity diode $D_3$, reference numeral 103 designates a mixer employing a junction field effect transistor $Q_1$, reference numeral 104 designates a band-pass filter employing a crystal filter, reference numeral 105 designates an intermediate frequency amplifier employing a transistor $Q_3$ serving as an amplitude limiter as well, reference numeral 107 designates a frequency discriminator in a ratio detector circuit arrangement, reference numeral 108 designates an output terminal of the demodulated signal, reference numeral 109 designates a low-pass filter consisting of a resistor and a capacitor, reference numeral 26 designates a positive power supply terminal, reference numeral 27 designates a negative power supply terminal, and reference numeral 28 designates a grounding terminal.

Reference numeral 110 designates a full-wave rectifier consisting of transistors $Q_4$ and $Q_5$ and diodes $D_1$ and $D_2$. When the base potential of the transistor $Q_4$ is higher than the ground potential, the collector potential of the transistor $Q_5$ becomes high to make the diode $D_2$ conductive. On the contrary, if the base potential of the transistor $Q_5$ becomes lower than the ground potential, the collector potential of the transistor $Q_4$ becomes high to make the diode $D_1$ conductive. Consequently, the output of the full-wave rectifier 110 is the full-wave rectified output of the frequency discriminator 107.

Reference numeral 111 designates an amplifier employing a junction field effect transistor $Q_6$ and resistors $R_1$ and $R_2$. The saturation and cut-off voltages of the amplifier are determined by the values of the resistors $R_1$ and $R_2$. An intermediate frequency signal derived from the midway of the intermediate frequency circuit through a capacity 17 is rectified by a detector 112 which is a voltage doubler rectifier circuit employing diodes $D_3$ and $D_4$ to be supplied to a switching circuit 113 consisting of a transistor $Q_7$ and resistors $R_3$ and $R_4$. When the intermediate frequency signal is supplied to the detector 112 to more than a certain amount, the switching circuit 113 becomes open, while when no intermediate signal is supplied to the detector 112, the switching circuit becomes conductive. Consequently, the drain voltage of the junction field effect transistor $Q_6$ of the amplifier 111 varies as represented by the curve 25 in FIG. 2d depending on the output of the full-wave rectifier 110. If this voltage is used as the source voltage of the transistor $Q_3$ of the intermediate frequency amplifier 105, the input voltage of the frequency discriminator 107 varies similarly to the curve 25 in FIG. 2d. Consequently, the frequency discriminator has a maximum discriminating sensitivity and a maximum output only when the intermediate frequency is around the tuned point and gradually attenuates with detuning to eventually reach a constant output determined by the saturation voltage of the amplifier 111. This output can be selected as desired by appropriately selecting the value of the resistors $R_1$ and $R_2$ composing the amplifier 111. If the detuning continues further, the switching circuit 113 operates to reduce the amplitude limiting level to zero so that no noise is outputted. Also when the signal is tuned to from a detuned point, a similar situation stands.

The automatic frequency control of the local oscillator 102 is made by converting the variation of the Dc output of the frequency discriminator 107 into the capacitance variation by supplying the output voltage of the low-pass filter 109 to the variable capacitance diode $D_5$.

We claim:

1. A demodulator for demodulating a received frequency-modulated signal, comprising:

local oscillating means for producing a local oscillation signal;

means for converting a received frequency-modulated signal into an intermediate frequency signal by mixing it with said local oscillation signal;

amplitude limiting means for limiting the amplitude of said intermediate frequency signal;

frequency discriminating means supplied with said amplitude limited intermediate frequency signal for demodulating a modulated signal;

means for outputting a demodulated signal from said frequency discriminating means;

a low-pass filter capable of passing therethrough a DC signal;

means for supplying a signal divided from said outputted demodulated signal to said low-pass filter;

means for full-wave rectifying the output of said low-pass filter and for producing a control signal which is maximum or minimum when the central frequency of said intermediate frequency signal is in agreement with the central frequency of the frequency characteristic of said frequency discriminating means and which decreases or increases depending on the amount of the discrepancy between said two frequencies;

means for controlling the amplitude limiting level of said amplitude limiting means by said control signal supplied thereto; means for detecting the magnitude of said converted intermediate frequency signal; and means for blocking the output signal of said frequency discriminating means when the intermediate frequency signal detected by said detecting means is smaller than a predetermined magnitude.

2. A demodulator according to claim 1, comprising means for supplying a signal divided from the output signal of said low-pass filter to said local oscillating means to automatically control the local oscillation frequency.

3. A demodulator for demodulating a received frequency-modulated signal, comprising:

local oscillating means for pdoducing a local oscillation signal;

means for converting a received frequency-modulated signal into an intermediate frequency signal by mixing it with said local oscillation signal;

amplitude limiting means for limiting the amplitude of said intermediate frequency signal;

frequency discriminating means supplied with said amplitude limited intermediate frequency signal for demodulating a modulated signal;

means for outputting a demodulated signal from said frequency discriminating means;

a low-pass filter capable of passing therethrough a DC signal;

means for supplying a signal divided from said outputted demodulated signal to said low-pass filter;

means for full-wave rectifying the output signal of said low-pass filter;

amplifying means being saturated with an input signal larger than a predetermined value for phase inverting and amplifying said full-wave rectified signal;

means for controlling the amplitude limiting level of said amplitude limiting means by the output signal of said amplifying means such that the output of said discriminating means is maximum only when the central frequency of said intermediate frequency signal is substantially in agreement with the central frequency of the frequency characteristic of said discriminating means;

means for detecting the magnitude of said converted intermediate frequency signal; and means for blocking the output signal of said frequency discriminating means when the intermediate frequency signal detected by said detecting means is smaller than a predetermined magnitude.

4. A demodulator according to claim 3, comprising means for supplying a signal divided from the output signal of said low-pass filter to said local oscillating means to automatically control the local oscillation frequency.

5. A demodulator for demodulating a received frequency-modulated signal, comprising:

local oscillating means for producing a local oscillation signal;

means for converting a received frequency-modulated signal into an intermediate frequency signal by mixing it with said local oscillation signal;

amplitude limiting means for limiting the amplitude of said intermediate frequency signal;

frequency discriminating means supplied with said amplitude limited intermediate frequency signal for demodulating a modulated signal;

means for outputting a demodulated signal from said frequency discriminating means;

a low-pass filter capable of passing therethrough a DC signal;

means for supplying a signal divided from said outputted demodulated signal to said low-pass filter;

means for full-wave rectifying the output signal of said low-pass filter;

amplifying means being saturated with an input signal larger than a predetermined value for phase inverting and amplifying said full-wave rectified signal;

means for controlling the amplitude limiting level of said amplitude limiting means by the output signal of said amplifying means such that the output of said discriminating means is maximum only when the central frequency of said intermediate frequency signal is substantially in agreement with the central frequency of the frequency characteristic of said discriminating means;

means for detecting the magnitude of said converted intermediate frequency signal; and means for blocking the input signal of said frequency discriminating means by grounding the output signal of said amplifying means to make the amplitude limiting level of said amplitude limiting means zero when the intermediate frequency signal detected by said detecting means is smaller than a predetermined magnitude.

6. A demodulator according to claim 5, comprising means for supplying a signal divided from the output signal of said low-pass filter to said local oscillating means to automatically control the local oscillation frequency.

* * * * *